US010068882B2

(12) United States Patent
Nakagawa et al.

(10) Patent No.: US 10,068,882 B2
(45) Date of Patent: Sep. 4, 2018

(54) HIGH-FREQUENCY MODULE

(71) Applicant: ALPS ELECTRIC CO., LTD., Tokyo (JP)

(72) Inventors: Masashi Nakagawa, Miyagi-ken (JP); Shoji Kai, Miyagi-ken (JP); Hideki Watanabe, Miyagi-ken (JP); Yoshihisa Shibuya, Miyagi-ken (JP); Shunji Kuwana, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/866,732

(22) Filed: Jan. 10, 2018

(65) Prior Publication Data
US 2018/0130778 A1 May 10, 2018

Related U.S. Application Data

(63) Continuation of application No. PCT/JP2016/065166, filed on May 23, 2016.

(30) Foreign Application Priority Data

Jul. 22, 2015 (JP) ................................. 2015-144634

(51) Int. Cl.
| H01L 23/28 | (2006.01) |
| H01L 25/16 | (2006.01) |
| H05K 1/14 | (2006.01) |
| H01L 23/04 | (2006.01) |
| H01L 23/50 | (2006.01) |
| H01Q 23/00 | (2006.01) |
| H01L 23/66 | (2006.01) |

(52) U.S. Cl.
CPC ............ *H01L 25/162* (2013.01); *H01L 23/04* (2013.01); *H01L 23/50* (2013.01); *H01L 23/66* (2013.01);
(Continued)

(58) Field of Classification Search
CPC ............... H01L 2924/181; H01L 23/66; H01L 2223/6677
(Continued)

(56) References Cited

U.S. PATENT DOCUMENTS 6,665,193 B1 * 12/2003 Chung ............. G06K 19/07749
174/257
6,774,470 B2 * 8/2004 Yagi ................. G06K 19/07749
257/679
(Continued)

FOREIGN PATENT DOCUMENTS

| JP | 2004-221964 A | 8/2004 |
| JP | 2006-041401 A | 2/2006 |

(Continued)

OTHER PUBLICATIONS

International Search Report for corresponding International Patent Application No. PCT/JP2016/065166, dated Jul. 19, 2016, 2 pages.

*Primary Examiner* — S. V. Clark
(74) *Attorney, Agent, or Firm* — Brinks Gilson & Lione

(57) ABSTRACT

A high-frequency module includes a wiring substrate, a high-frequency circuit including circuit components disposed on the upper surface of the wiring substrate, a post made of metal and disposed on the upper surface of the wiring substrate, a sealing resin covering the circuit components, and an antenna substrate disposed on the upper surface of the sealing resin and having an antenna formed by a metal pattern. A groove is provided on the sealing resin, at least a part of the post is exposed from the groove, a central surface and two opposing side wall surfaces located higher than the central surface are formed at the upper side of the post, and a conductive adhesive is bonded to the central surface, the two side wall surfaces, and the antenna.

3 Claims, 7 Drawing Sheets

(52) U.S. Cl.
CPC ............... H01Q 23/00 (2013.01); H05K 1/14 (2013.01); *H01L 2223/6677* (2013.01); *H01L 2224/48091* (2013.01); *H01L 2924/15311* (2013.01); *H01L 2924/19105* (2013.01)

(58) Field of Classification Search
USPC ........................................ 257/678, 787, 798
See application file for complete search history.

(56) References Cited

U.S. PATENT DOCUMENTS

| | | | |
|---|---|---|---|
| 7,199,718 B2* | 4/2007 | Kikuchi | G06K 19/0773 257/787 |
| 2004/0077124 A1* | 4/2004 | Ogawa | H01L 21/4857 438/106 |
| 2006/0022320 A1 | 2/2006 | Nakanishi et al. | |
| 2007/0029667 A1 | 2/2007 | Fujii et al. | |
| 2008/0042851 A1* | 2/2008 | Baba | G06K 19/027 340/572.8 |
| 2010/0059899 A1* | 3/2010 | Sakurai | G06K 19/07728 257/787 |

FOREIGN PATENT DOCUMENTS

| | | |
|---|---|---|
| JP | 2007-042978 A | 2/2007 |
| JP | 2016-103702 A | 6/2016 |

* cited by examiner

HIGH-FREQUENCY MODULE

CLAIM OF PRIORITY

This application is a Continuation of International Application No. PCT/JP2016/065166 filed on May 23, 2016, which claims the benefit of Japanese Patent Application No. 2015-144634 filed on Jul. 22, 2015. The entire contents of each application noted above are hereby incorporated by reference.

BACKGROUND

1. Field of the Disclosure

The present disclosure relates to a high-frequency module and particularly relates to a high-frequency module in which an antenna is provided.

2. Description of the Related Art

In recent years, a high-frequency module in which a circuit component on a wiring substrate is sealed by a resin and an antenna is formed on the resin has been developed in order to reduce size. In such a high-frequency module, it is necessary to electrically connect the wiring substrate and the antenna. Japanese Unexamined Patent Application Publication No. 2007-042978 discloses a high-frequency module having a structure in which an antenna is formed on a sealing resin on a wiring substrate and the wiring substrate and the antenna are electrically connected to each other. A semiconductor device 900 that is such a high-frequency module will be described with reference to FIG. 7.

The semiconductor device 900 includes a wiring substrate 911 that has a feed layer 924 and a ground conductive layer 927, an inverse F type antenna 920 is provided on a sealing resin 917 covering a connected semiconductor chip 912 and a chip component 913 on the wiring substrate 911, and the inverse F type antenna 920 is electrically connected to the feed layer 924 and the ground conductive layer 927.

The inverse F type antenna 920 and the feed layer 924 are connected to each other by means of solder via a terminal 914 disposed on a connection portion 932B connected to the feed layer 924. In addition, the inverse F type antenna 920 and the ground conductive layer 927 are connected to each other by means of solder via a terminal 915 disposed on a connection portion 933B connected to the ground conductive layer 927. Each of the terminal 914 and the terminal 915 has a block shape, and a conductive material, for example, cupper, is used as the material thereof. A connection portion of the inverse F type antenna 920 and the terminal 914 and a connection portion of the inverse F type antenna 920 and the terminal 915 are surrounded by the sealing resin 917.

With such a configuration, an effect that it is possible to provide a semiconductor device that allows its size to be reduced and allows its cost to be reduced, is achieved.

In the semiconductor device 900, as described above, a conductive material, that is, a metal, is used as the material of the terminal 914 and the terminal 915. In addition, for example, a mold resin is used as the material of the sealing resin 917.

However, the coefficients of thermal expansion of the metal and the resin are different from each other, and the coefficient of thermal expansion of the resin is higher than the coefficient of thermal expansion of the metal. Thus, the connection portion of the inverse F type antenna 920 and the terminal 914 and the connection portion of the inverse F type antenna 920 and the terminal 915 may be peeled, due to the ambient temperature becoming high, to cause a wire breakage. Therefore, as a result, the reliability of the semiconductor device 900 is decreased.

SUMMARY

A high-frequency module includes: a wiring substrate; a high-frequency circuit including circuit components disposed on an upper surface of the wiring substrate; a post comprised of metal and disposed on the upper surface of the wiring substrate; a sealing resin covering the circuit components; and an antenna substrate disposed on an upper surface of the sealing resin and having an antenna formed by a metal pattern. A groove is provided on the sealing resin, at least a part of the post is exposed from the groove, a central surface and two opposing side wall surfaces located higher than the central surface are formed at an upper side of the post, and a conductive adhesive is bonded to the central surface and the two side wall surfaces of the post and the antenna.

In the high-frequency module configured as described above, the conductive adhesive is bonded to three surfaces, that is, the central surface and the two side wall surfaces of the post made of metal, there is a low possibility that the conductive adhesive is peeled, and there is also a low possibility that connection between the antenna and the high-frequency circuit on the wiring substrate is cut. As a result, it is possible to provide a high-frequency module having high reliability.

DESCRIPTION OF THE EXEMPLARY EMBODIMENTS

Hereinafter, a high-frequency module 100 according to embodiments the present invention will be described with reference to the drawings. The high-frequency module 1 is, for example, a small high-frequency module that is used for a wireless LAN (Local Area Network) or the like and that has an antenna. The use of the high-frequency module 100 according to the present invention is not limited to an embodiment described below, and is changeable as appropriate.

Figure 1:
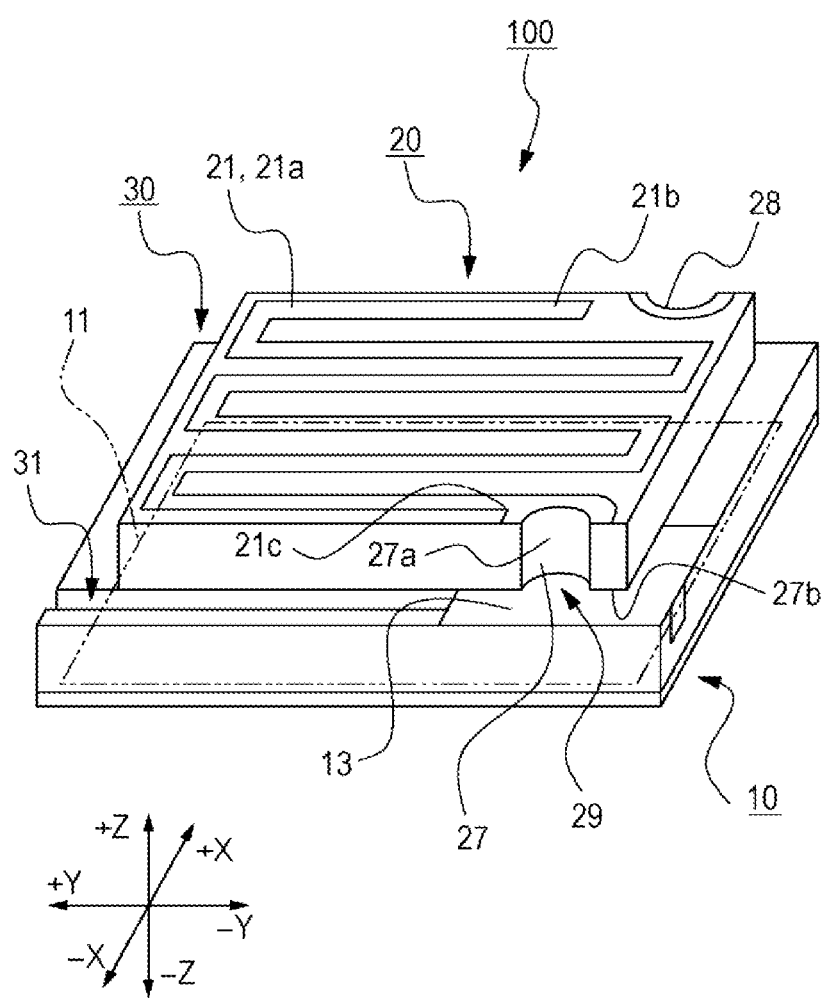
FIG. 1 is a perspective view showing the appearance of a high-frequency module.
Figure 2:
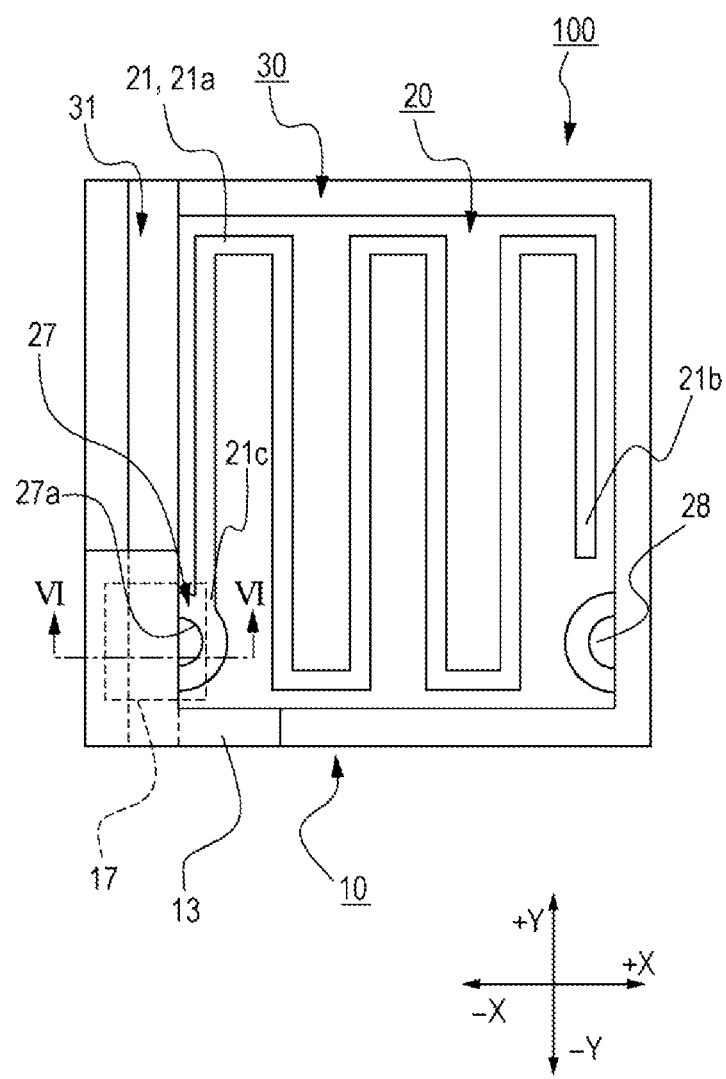
FIG. 2 is a plan view of the high-frequency module as seen from above.
Figure 3:
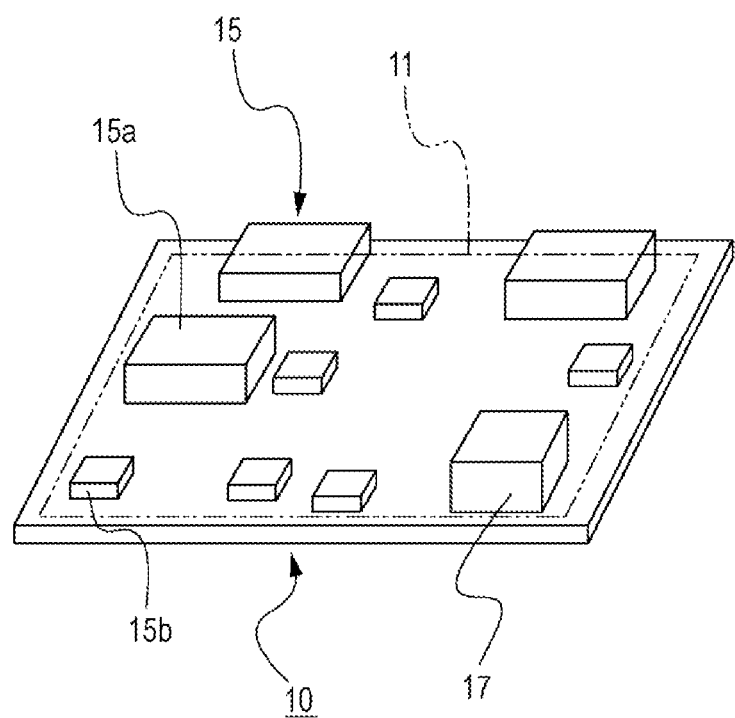
FIG. 3 is a perspective view of a wiring substrate on which circuit components are disposed.
Figure 3:
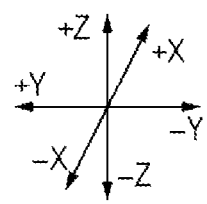
Figure 4:
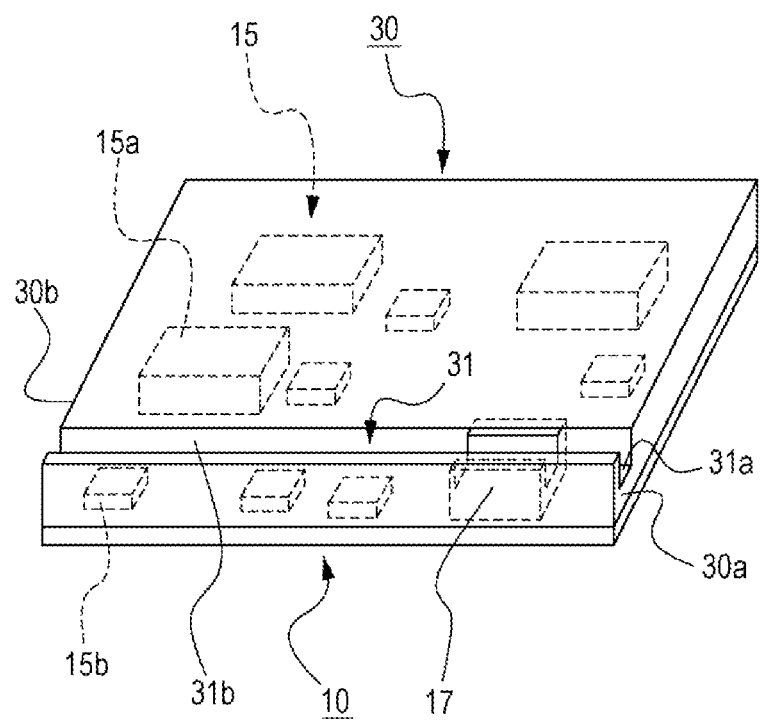
FIG. 4 is a perspective view showing the wiring substrate and a sealing resin on which a groove is formed.
Figure 4:
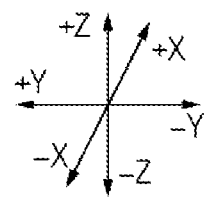
Figure 5:
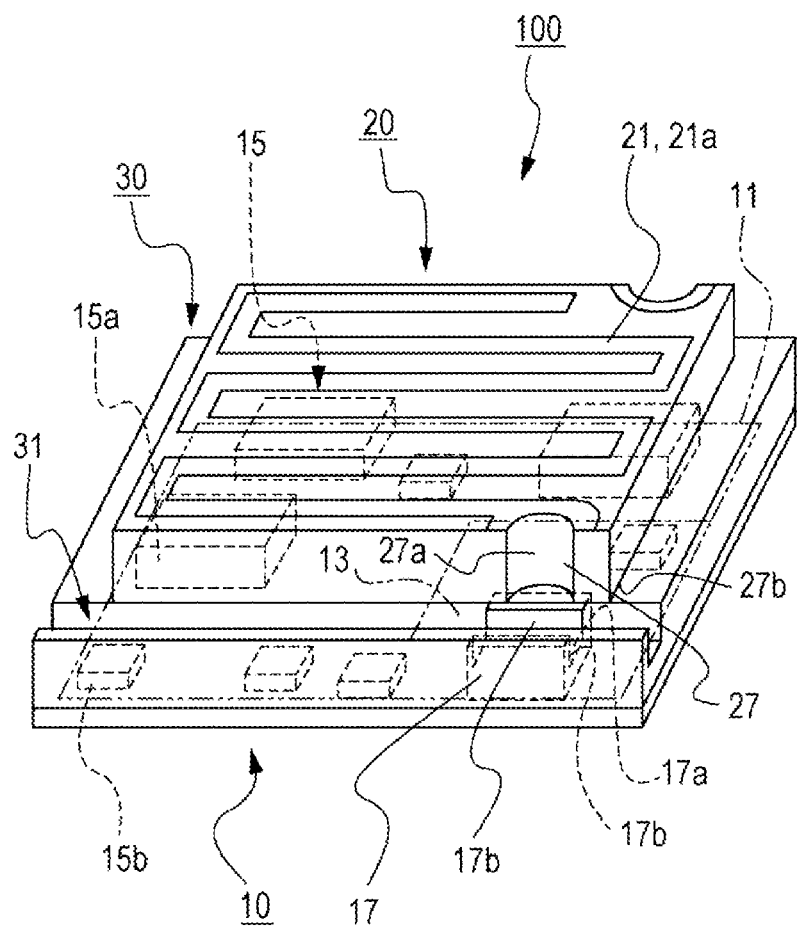
FIG. 5 is a perspective view showing the wiring substrate, the sealing resin, and an antenna substrate.

First, a schematic structure of the high-frequency module 100 according to an embodiment of the present invention, the configuration on a wiring substrate 10, and a method for forming a sealing resin 30 will be described with reference to FIGS. 1 to 5. FIG. 1 is a perspective view showing the appearance of the high-frequency module 100, and FIG. 2 is a plan view of the high-frequency module 100 as seen from above. In addition, FIG. 3 is a perspective view of the wiring substrate 10 on which circuit components 15 are disposed, FIG. 4 is a perspective view showing the wiring substrate 10 and the sealing resin 30 on which a groove 31 is formed, and FIG. 5 is a perspective view showing the wiring substrate 10, the sealing resin 30, and an antenna substrate 20. In FIG. 5, on the assumption that a conductive adhesive 13 is transparent, the conductive adhesive 13 is shown by a chain double dashed line.

As shown in FIG. 1, the high-frequency module 100 is configured to include the wiring substrate 10 having a rectangular shape, the sealing resin 30 that covers the wiring substrate 10, and the antenna substrate 20 that is disposed on the upper surface of the sealing resin 30 and that has a rectangular shape with a smaller area than the wiring substrate 10. An antenna 21 is formed on the antenna substrate 20 by a metal pattern 21a having conductivity. In addition, a high-frequency circuit 11 is formed on the wiring substrate 10, and the antenna 21 and the high-frequency circuit 11 are connected to each other. The high-frequency module 100 is produced by cutting an aggregate substrate (not shown) formed by a plurality of wiring substrates 10, a plurality of antenna substrates 20, and a plurality of sealing resins 30.

As shown in FIGS. 1 and 2, in the present embodiment, as the antenna 21, a monopole antenna that has a meander shape and that has an open end 21b is adopted, but the antenna 21 may be an another type of antenna such as an inverse F type antenna.

A side through hole 29 is preferably provided on a side surface of the antenna substrate 20, and an electrode portion 27 is preferably formed on a surface of the side through hole 29. The electrode portion 27 is formed by cutting the side through hole 29 in a Z direction in a state of the aggregate substrate. The electrode portion 27 is connected to a feed terminal 21c of the antenna 21.

The electrode portion 27 is provided at an end portion at the −Y side of one side at the −X side of the antenna substrate 20 shown in FIG. 1, and is formed by a side surface electrode portion 27a formed on a surface of the side through hole 29 and a lower surface electrode portion 27b formed on the lower surface of the side through hole 29. The electrode portion 27, which is composed of the side surface electrode portion 27a and the lower surface electrode portion 27b, is preferably connected to a high-frequency circuit 11 by the conductive adhesive 13.

An electrode portion 28 is provided at another side at the +X side opposing the one side at the −X side of the antenna substrate 20 at which the electrode portion 27 is provided. The electrode portion 28 is not connected to any of the high-frequency circuit 11 on the wiring substrate 10 and the antenna 21 on the antenna substrate 20. The electrode portion 28 is a portion of an electrode portion for another antenna substrate on the aggregate substrate that is formed when the antenna substrate 20 is produced by cutting the aggregate substrate, is not used for the high-frequency module 100, and does not influence the high-frequency module 100.

As shown in FIG. 3, before the sealing resin 30 is formed, a plurality of circuit components 15 such as an integrated circuit are disposed on the wiring substrate 10 and mounted on the wiring substrate 10 by means of solder. The circuit components 15 preferably include first circuit components 15a and second circuit components 15b having lower heights than the first circuit components 15a. The plurality of respective circuit components 15 are connected to each other by a wiring pattern (not shown), whereby the high-frequency circuit 11 is formed. As described above, the antenna 21 is connected to the high-frequency circuit 11, and high-frequency signals transmitted or received by the antenna 21 are subjected to signal processing in the high-frequency circuit 11.

On the wiring substrate 10, a post 17 made of metal is disposed at the same time when the circuit components 15 are disposed, and is mounted on the wiring substrate 10 by means of solder. The post 17 is connected to the high-frequency circuit 11 by a wiring pattern (not shown).

The sealing resin 30 is formed on the wiring substrate 10 on which the plurality of circuit components 15 and the post 17 are mounted. As shown in FIG. 4, the sealing resin 30 is preferably formed in a rectangular shape over the substantially entire area of the wiring substrate 10 so as to cover the circuit components 15 and the post 17. As the material of the sealing resin 30, for example, a mold resin is used.

The groove 31 is provided on the sealing resin 30. As shown in FIG. 4, the groove 31 is preferably provided along a side at the −X side of the sealing resin 30, which is provided in a rectangular shape, and with a uniform width from one side 30a at the −Y side to another side 30b at the +Y side opposing the one side 30a.

As described above, the high-frequency module 100 is produced by cutting the aggregate substrate. In the case of providing the groove 31 on the sealing resin 30, similarly, after the sealing resin 30 is formed in a state of the aggregate substrate, the groove 31 is formed in the state of the aggregate substrate. A dicing device is used for forming the groove 31. As the dicing device, a dicing device that is used in cutting an aggregate substrate completed as a plurality of high-frequency modules into individual high-frequency modules 100 may be used, and thus a new device for forming the groove 31 is not required.

In the present embodiment, as shown in FIGS. 1 and 2, the groove 31 is formed at the side opposite to the side at which the open end 21b of the antenna 21 is present, that is, at the side at which the feed terminal 21c is present. By forming the groove 31 at the side at which the feed terminal 21c having a relatively low antenna potential is present and making the groove 31 away from the side at which the open end 21b of the antenna 21 is present, it is possible to make it less likely to influence the characteristics of the antenna 21.

As shown in FIGS. 2 and 4, the groove 31 is formed so as to traverse a central portion in the X direction of the post 17, which is mounted on the wiring substrate 10. The groove 31 is formed by a bottom portion 31a and opposing two side wall portions 31b. The position of the bottom portion 31a of the groove 31 from the upper surface of the wiring substrate 10 is set so as to be lower than the position of the upper surface of the post 17. Thus, after the groove 31 is formed, the central portion of the post 17, which is made of metal, is cut out along the Y direction with the same width as that of the groove 31. As a result, the post 17 is formed in a U cross-sectional shape as shown in FIG. 4.

As described above, the circuit components 15 includes the first circuit components 15a having high heights and the second circuit components 15b having lower heights than the first circuit components 15a. Below the groove 31, the first circuit components 15a having high heights are not disposed, and the second circuit components 15b having low heights are preferably disposed. The heights of the second circuit components 15b from the upper surface of the wiring substrate 10 are set so as to be lower than the position of the bottom portion 31a of the groove 31 from the upper surface of the wiring substrate 10. Thus, even when the second circuit components 15b are disposed below the groove 31, the upper portions of the second circuit components 15b do not project upward from the bottom portion 31a of the groove 31.

After the groove 31 is provided on the sealing resin 30 and the post 17 is formed in a U cross-sectional shape, the antenna substrate 20 is provided on the upper surface of the sealing resin 30 as shown in FIG. 5.

Figure 6:
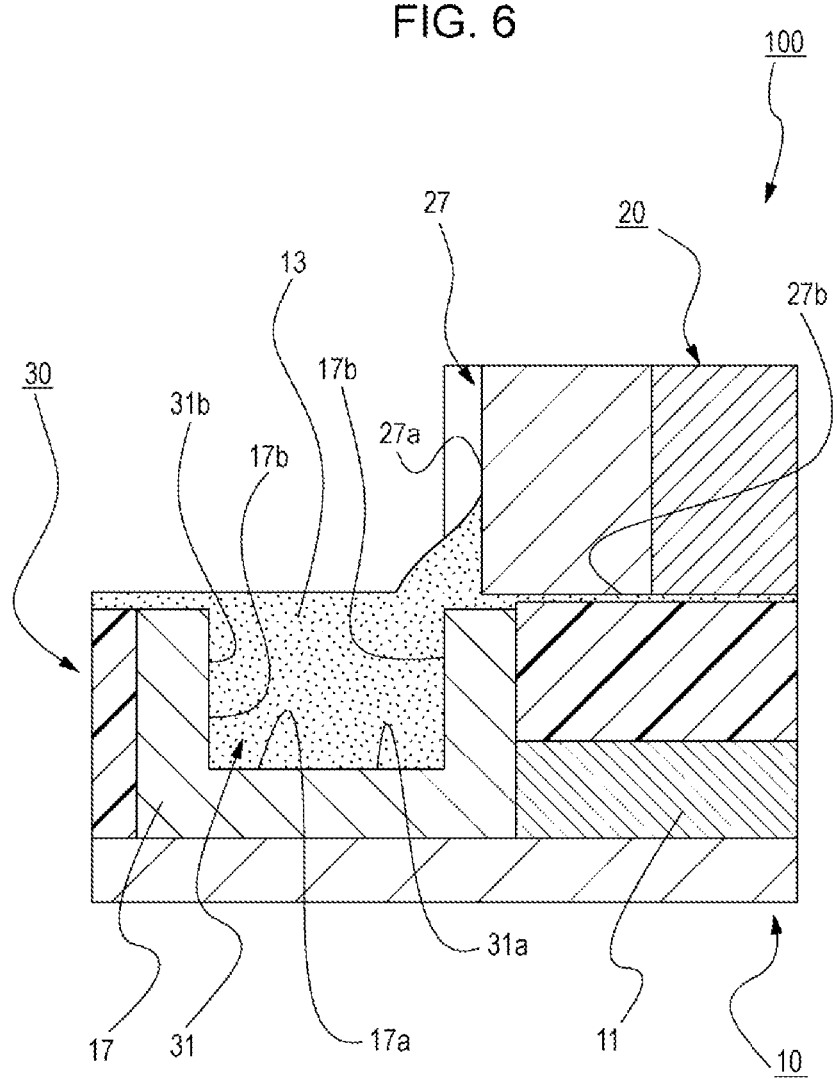
FIG. 6 is an enlarged cross-sectional view showing a connection portion of an electrode portion and a post.
Figure 7:
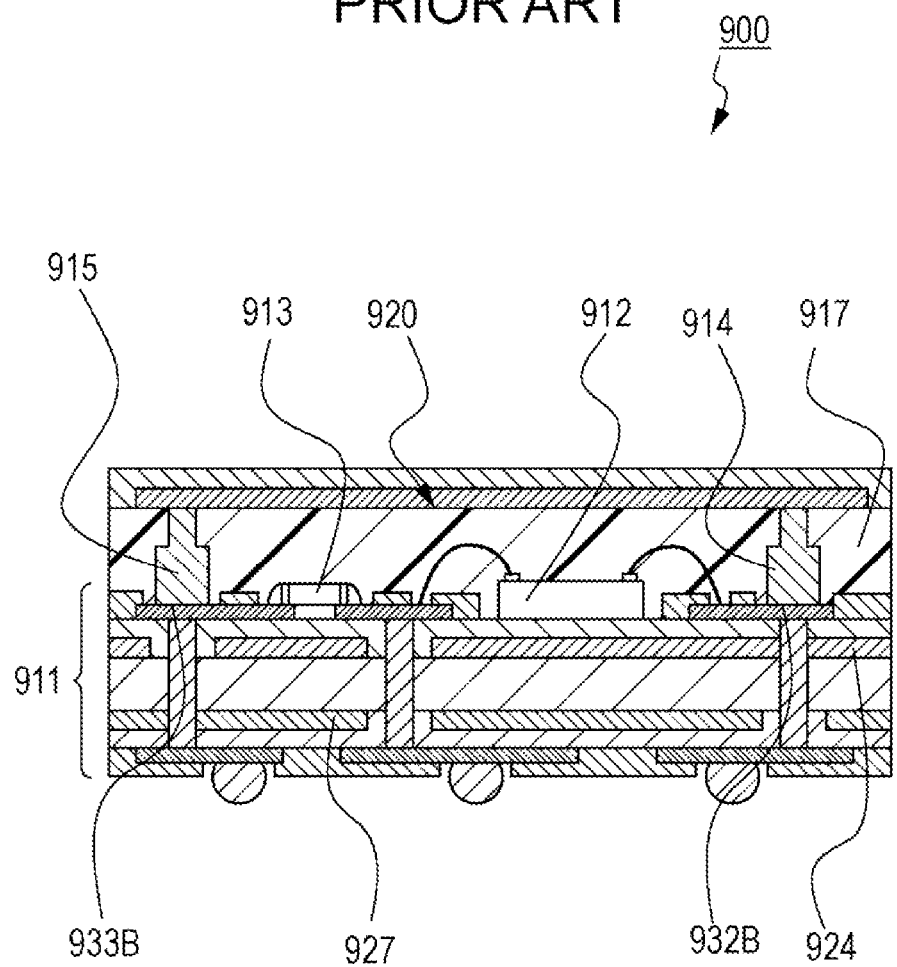
FIG. 7 is a cross-sectional view of a semiconductor device related to a related art example.

Bonding and electric connection between the antenna substrate 20 and the wiring substrate 10 will be described with reference to FIGS. 5 and 6. FIG. 6 is an enlarged cross-sectional view, as seen from the line VI-VI shown in FIG. 2, showing a connection portion of the electrode portion 27 and the post 17.

As described above, the post 17 provided on the wiring substrate 10 is formed in a U cross-sectional shape. By forming the post 17 in a U cross-sectional shape, a central surface 17a and two opposing side wall surfaces 17b located higher than the central surface 17a are formed at the upper side of the post 17 as shown in FIGS. 5 and 6. Therefore, at least a part of the post 17, that is, the central surface 17a and the side wall surfaces 17b, are exposed from the groove 31. In other words, the central surface 17a and the side wall surfaces 17b of the post 17 form parts of the bottom portion 31a and the side wall portions 31b of the groove 31, respectively. Here, the post 17 is already connected to the high-frequency circuit 11, which is formed on the wiring substrate 10, by a wiring pattern (not shown).

Before the antenna substrate 20 is disposed on the upper surface of the sealing resin 30, a non-conductive adhesive (not shown) is applied to a substantially central portion of the upper surface of the sealing resin 30, and the conductive adhesive 13 such as a silver paste is applied to a part of the upper surface of the sealing resin 30.

As shown in FIG. 5, the conductive adhesive 13 is applied to the upper surface of the sealing resin 30 in an area around a location where the electrode portion 27 of the antenna substrate 20 is disposed, and is also applied so as to fill a portion surrounded by the bottom portion 31a and the two side wall portions 31b of the groove 31, including a portion surrounded by the central surface 17a and the two side wall surfaces 17b of the post 17, as shown in FIGS. 5 and 6.

Thereafter, by disposing the antenna substrate 20 on the upper surface of the sealing resin 30, the substantially central portion of the antenna substrate 20 is bonded to the upper surface of the sealing resin 30, and the lower surface electrode portion 27b of the electrode portion 27 of the antenna substrate 20 is bonded to the upper surface of the sealing resin 30 by the conductive adhesive 13. In addition, the conductive adhesive 13 is bonded to the side surface electrode portion 27a of the electrode portion 27. At the same time, the conductive adhesive 13 is bonded to the central surface 17a of the post 17 and the two side wall surfaces 17b of the post 17.

As a result, the electrode portion 27 of the antenna substrate 20 is assuredly connected to the post 17 on the wiring substrate 10. That is, the antenna 21 and the high-frequency circuit 11 are assuredly connected to each other.

The connection portion of the electrode portion 27, which is formed of a metal, and the post 17, which is made of metal, is not surrounded by the sealing resin 30 having a coefficient of thermal expansion different from those of the electrode portion 27 and the post 17. Thus, there is a low possibility that the connection portion of the electrode portion 27 and the post 17 is peeled due to a temperature change.

Hereinafter, advantageous effects achieved by the present embodiment will be described.

In the high-frequency module 100, the conductive adhesive 13 is bonded to three surfaces, that is, the central surface 17a and the two side wall surfaces 17b of the post 17. Thus, there is a low possibility that the conductive adhesive 13 is peeled, and there is also a low possibility that the connection between the antenna 21 and the high-frequency circuit 11 on the wiring substrate 10 is cut. As a result, it is possible to provide the high-frequency module 100 having high reliability.

Since the second circuit components 15b having low heights are disposed below the groove 31, it is possible to efficiently dispose the plurality of circuit components 15 on the wiring substrate 10. As a result, it is possible to contribute to size reduction of the high-frequency module 100.

Since the electrode portion 27 is formed on a surface of the side through hole 29, it is possible to easily connect the electrode portion 27 and the post 17.

As described above, in the high-frequency module according to the present invention, the conductive adhesive is bonded to three surfaces, that is, the central surface and the two side wall surfaces of the post made of metal, there is a low possibility that the conductive adhesive is peeled, and there is also a low possibility that the connection between the antenna and the high-frequency circuit on the wiring substrate is cut. As a result, it is possible to provide a high-frequency module having high reliability.

The present invention is not limited to the above embodiment, and various modifications may be made without departing from the gist of the present invention, to implement the present invention.

What is claimed is:

1. A high-frequency module comprising:

a wiring substrate;

a high-frequency circuit including circuit components disposed on an upper surface of the wiring substrate;

a post comprised of metal and disposed on the upper surface of the wiring substrate;

a sealing resin covering the circuit components; and an antenna substrate disposed on an upper surface of the sealing resin and having an antenna comprising a metal pattern, wherein:

a groove is provided on the sealing resin, and at least a part of the post is exposed from the groove, a central surface and two opposing side wall surfaces located higher than the central surface are formed at an upper side of the post, and a conductive adhesive is bonded to the central surface and the two side wall surfaces of the post and the antenna.

2. The high-frequency module according to claim 1, wherein the sealing resin is provided in a rectangular shape, and the groove provided on the sealing resin is provided with a uniform width from one side of the sealing resin provided in a rectangular shape to another side of the sealing resin opposing the one side, and the circuit components include a first circuit component and a second circuit component having a lower height than the first circuit component, and the second circuit component is disposed below the groove.

3. The high-frequency module according to claim 1, wherein:
  a side through hole is provided on a side surface of the antenna substrate, and an electrode portion is formed on a surface of the side through hole, and
  the electrode portion is connected to the post by the conductive adhesive.

* * * * *